Dec. 10, 1968 A. J. CERTA 3,415,648
PVA ETCH MASKING PROCESS
Filed Aug. 7, 1964
(A)
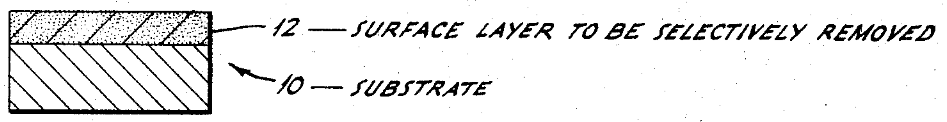
(B)
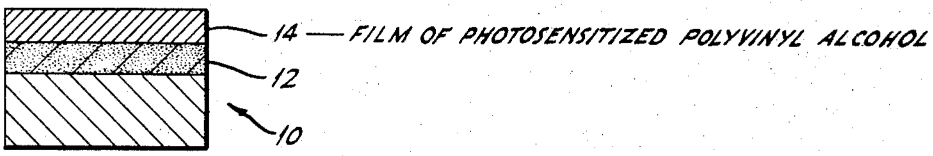
(C)
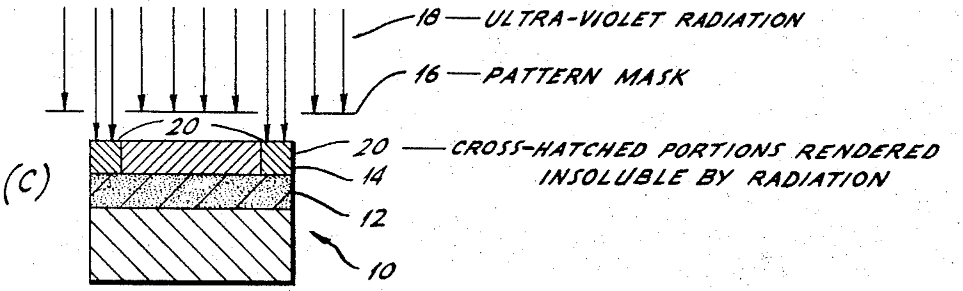
(D)
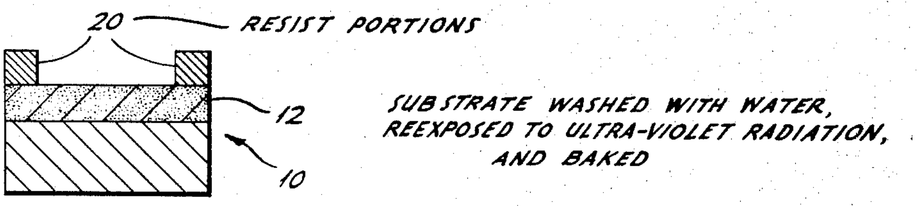
(E)
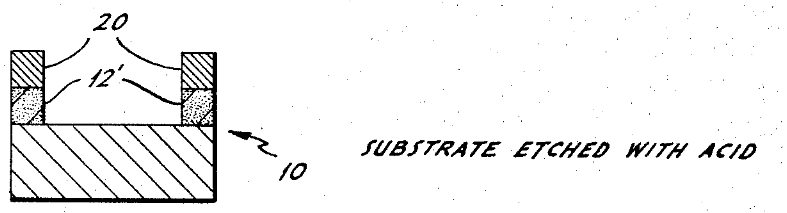
(F)
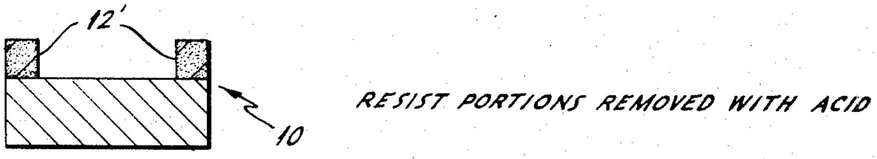
INVENTOR.
ANTHONY J. CERTA
BY D R Pressman
ATTORNEY 3,415,648

PVA ETCH MASKING PROCESS

Anthony J. Certa, Norristown, Pa., assignor to Philco-Ford Corporation, a corporation of Delaware Filed Aug. 7, 1964, Ser. No. 388,200
2 Claims. (Cl. 96—36)

ABSTRACT OF THE DISCLOSURE

Formation of highly adherent etch mask by coating substrate with photosensitized PVA film, exposing film through mask to actinic radiation, washing film to remove unexposed portions, and re-exposing film, as washed, to actinic radiation to cause film to have good adherence.

This invention relates to the process of photolithographic etching of surface layers of a substrate and particularly to such a process wherein a photosensitive film is selectively exposed to light and developed in order to form a resist pattern for a subsequent acid engraving process.

As part of the fabrication of printed circuit boards, semiconductors, microcircuits, thin film devices, etc., material must be removed in areas of predetermined shape from the surface layer of a wafer or substrate. This is usually done by masking the areas of the surface layer where material is not to be removed with a material, commonly called a resist, which is impervious to an etchant of said surface layer and then applying an etchant to the entire surface to remove material from the unmasked areas of the surface layer. The resist is then removed with a suitable solvent.

It will be appreciated that an important step in the above process is the selective masking of the surface layer with the resist. Many techniques for applying a resist in a desired pattern are known, including screening, offset printing, and photolithography, but it has been found that the last is most suitable for the fabrication of electronic circuits and circuit components.

According to standard photolithographic resist masking techniques, the entire surface layer of a substrate is coated with a very thin layer of a photosensitive solution which is then selectively exposed to light with the aid of a suitable negative pattern mask. The exposed portions of the resist are thereby rendered insoluble in a solvent which will readily remove the unexposed portions. The substrate is then washed with a solvent; the exposed areas will be insoluble in the solvent and hence will remain intact while the unexposed areas will be dissolved and washed away by the solvent. The substrate is next baked to harden the resist. The surface is then etched with a substance which will attack the surface layer of the substrate but not the resist in order to remove the unmasked portions of the surface layer. The hardened resist is thereafter removed with another solvent.

The type of photosensitive solution used will materially affect the process. Heretofore, proprietary solutions designed primarily for the photoengraving arts have proven most desirable although these have several disadvantages. Since these solutions are proprietary, users do not know the exact compositions thereof. The compositions can change without the user's knowledge and these changes can adversely affect semiconductor processes although not affecting conventional intended processes such as photoengraving. Also, these solutions are relatively difficult to remove from the substrate after etching has been completed; mechanical swabbing is usually necessary. In addition, one solution tends to deteriorate under acid etching, producing pin holes in the surface layer, while another does not have good photographic resolution properties. These solutions must be developed with special organic compounds. Photosensitized polyvinyl alcohol has also been used as a resist solution but this was found to have poor adherence in addition to other drawbacks.

OBJECTS

Accordingly several objects of the present invention are:

(1) To provide a new and improved photolithographic masking process, (2) To provide a photolithographic masking process which uses only known chemicals, (3) To provide a photolithographic masking process wherein the resist has excellent adherence, resolution properties, and is insensitive to acid etchants.

Other objects and advantages of the invention will become apparent from a consideration of the ensuing description thereof.

SUMMARY

According to the present invention a polyvinyl alcohol solution is used as a photosensitive resist. The solution is applied to a substrate, exposed through a pattern mask, washed, exposed again without the mask, and baked to form the resist.

DRAWING

The various stages of the process of the invention are depicted in the single figure of the drawing.

DESCRIPTION OF PROCESS

The process will be explained in relation to the several lettered stages of the drawing.

A.—Substrate to be selectively etched

In stage A is shown a cross section of a substrate 10 having a surface layer 12 which is to be selectively etched away in a predetermined pattern. The process of the invention is adaptable to almost all photolithographic etch applications, and hence substrate 10 with surface layer 12 may be comprised of many different materials. For instance substrate 10 may be a wafer of semiconductive material such as silicon and layer 12 may be an oxide thereof through which holes are to be etched for dopant diffusions subsequently to form devices such as transistors, diodes, and integrated circuits. Alternatively, substrate 10 may comprise a phenolic printed circuit board with 12 the conductive copper surface layer. Substrate 10 may also comprise a glass plate and layer 12 may be a tantalum film which is to be selectively etched to form resistors and capacitors for thin film circuits. (See, e.g., the copending application of F. Murray and T. V. Sikina, S.N. 232,539, filed Oct. 23, 1962 now U.S. Patent 3,256,588, and the copending application of M. Casey, Ser. No. 322,211 filed Nov. 7, 1963 now abandoned, both assigned to the present assignee.)

B.—Substrate coated with photosensitive film

The surface of layer 12 of film 10 is next coated with a film 14 of a photosensitized polyvinyl alcohol (PVA) which may be fabricated as follows:

Combine: (1) 2400 ml. of deionized water; (2) 110 gm. of 85% hydrolyzed polyvinyl acetate (commercially available as Du Pont "Elvanol" grade 52–22); (3) 1200 ml. of anhydrous methyl alcohol; add to 100 ml. of above solution the following sensitizer; (4) 2 ml. of 22% by weight ammonium dichromate in $H_2O$.

The film 14 of the PVA solution may be applied to a typical substrate such as oxidized silicon according to the following procedure. The substrate is scrubbed with trichlorethylene, rinsed, scrubbed with methyl alcohol, blown dry with filtered nitrogen, and placed in an air oven at 150° C. for 10 minutes. Sufficient PVA solution is applied to the substrate to form a meniscus thereover. The substrate is then spun at 1300 r.p.m. for about 1 minute to reduce the PVA solution to film thickness. Details of the above steps are not to be considered limiting but only as one suggested optimum technique. The invention is applicable to any type of photosensitized polyvinyl alcohol.

C.—Exposure through pattern mask

An opaque pattern mask 16 having apertures as indicated is placed over the substrate and ultra violet radiation 18 is allowed to shine on the mask so that only the areas 20 of the substrate under the apertures will be exposed. The areas 20 of film 14 will be rendered insoluble in water by the radiation, while the unexposed areas will remain soluble. A suitable type of radiation 18 may be obtained by exposing the substrate to a 30 foot candle ultra violet light for 20 seconds.

D.—Wash, reexpose, bake

The substrate is next developed by washing the same with deionized water for about 30 seconds and then spraying with deionized water for 30 seconds. The deionized water dissolves and removes the unexposed portions of PVA layer 14, leaving a resist structure as shown in stage D. (The spray is used to force the deionized water into the narrowest corners of the PVA film to provide a resist with higher definition.)

The substrate is then reexposed to ultra violet radiation. Again, a 20 second exposure to a 30 foot candle light has been found to be satisfactory. This step is a critical one in the process of the invention. It was found that if this reexposure step were omitted, or even combined with the initial exposure step, the developed resist would have poor adherence and would tend to peel excessively. The reason for the success of the process when the reexposure step is incorporated is still unknown. However, it is theorized that during the developing step, the exposed PVA film absorbs some water, especially at the region of its interface with layer 12. This absorbed water has a deleterious effect on film adherence which is obviated by reexposure. Use of the reexposure step in conjunction with the PVA solution provided superior resists than with any previous types, including the proprietary types aforediscussed.

After the second exposure the substrate is dried with flowing nitrogen and baked at about 210° C. for 1 hour to harden the resist.

E.—Etch

The substrate is next placed in a suitable etchant for removal of the unmasked portions of layer 12. If layer 12 is silicon dioxide, as would be the case in fabrication of semiconductive devices, a suitable etchant would be buffered hydrofluoric acid. The resulting structure will appear as in stage E with only portions 12' of layer 12 remaining.

F.—Resist removal

As a last step resist 20 is removed by immersing the substrate in hot chromic acid for 5 minutes. This will yield the structure shown in stage F. After the substrate is rinsed and blown dry it is ready for subsequent processing operations depending on the nature of the substrate which was etched.

APPLICATION OF PROCESS

The process of the invention, although not limited thereto, has been successfully used to etch diffusion holes for the fabrication of voltage variable capacitance diodes. In this application substrate 10 and layer 12 represent an epitaxed silicon layer and its oxide, respectively. The part of oxide 12 which is removed constitutes a hole through the oxide film 12 which a region of opposite conductivity can be diffused to form a P–N junction within layer 10.

Although the above description contains many details, the scope of the invention is not limited thereto, but is indicated by the appended claims only.

I claim:

1. A process for forming a highly adherent and continuous etch masking film on a substrate, comprising:
   - coating said substrate with a film of photosensitized polyvinyl alcohol,
   - exposing a portion of said film to actinic radiation to harden the exposed portion thereof,
   - developing said film by washing said film with water to remove the unexposed portion thereof, and
   - reexposing the remaining, exposed portion of said film to said actinic radiation without resensitizing the developed film, whereby a continuous film having high adherence to said substrate is obtained.

2. A process for forming a highly adherent and continuous etch masking film on a substrate, comprising:
   - coating said substrate with a film of photosensitized polyvinyl alcohol,
   - exposing a portion of said film to actinic radiation to harden the exposed portion thereof,
   - developing said film by washing said film with water to remove the unexposed portion thereof, and
   - with the remaining, exposed portion of said film in the chemical and physical state existing immediately after said washing with water, reexposing said remaining, exposed portion of said film to said actinic radiation so as to create good adherence between said film and said substrate without destroying the continuity of said film, whereby said film will serve as a durable etch mask.

References Cited

UNITED STATES PATENTS

| | | | |
|---|---|---|---|
| 1,840,529 | 1/1932 | Roehrich | 96—36 |
| 2,827,390 | 3/1958 | Garrigus | 96—36.1 X |
| 3,230,088 | 1/1966 | Adams et al. | 96—36.3 |
| 3,255,005 | 6/1966 | Green | 96—36 |

NORMAN G. TORCHIN, *Primary Examiner.*

R. E. MARTIN, *Assistant Examiner.*

U.S. Cl. X.R.

96—36.2, 36.3